(12) United States Patent
Banerjee et al.

(10) Patent No.: US 9,968,016 B2
(45) Date of Patent: May 8, 2018

(54) MAGNETIC FIELD SHIELD

(71) Applicant: Toyota Motor Engineering & Manufacturing North America, Inc., Erlanger, KY (US)

(72) Inventors: Debasish Banerjee, Ann Arbor, MI (US); Hideo Iizuka, Nagakute Aichi (JP)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 941 days.

(21) Appl. No.: 14/456,480

(22) Filed: Aug. 11, 2014

(65) Prior Publication Data
US 2016/0044837 A1    Feb. 11, 2016

(51) Int. Cl.
*H04B 3/00*     (2006.01)
*H04B 15/00*    (2006.01)
*H05K 9/00*     (2006.01)

(52) U.S. Cl.
CPC ......... *H05K 9/0071* (2013.01); *H05K 9/0052* (2013.01)

(58) Field of Classification Search
CPC ................... H05K 9/0052; H05K 9/0071
See application file for complete search history.

(56) References Cited

U.S. PATENT DOCUMENTS

| | | | | |
|---|---|---|---|---|
| 5,186,181 A * | 2/1993 | Franconi | ................. | A61N 5/02 607/156 |
| 5,262,028 A * | 11/1993 | Manley | ............... | H01J 37/3408 204/192.12 |
| 5,826,178 A * | 10/1998 | Owen | .................... | H01Q 7/005 343/741 |
| 5,828,213 A * | 10/1998 | Hickman | ............... | G01N 27/82 324/232 |
| 8,451,080 B2 | 5/2013 | Lee et al. | | |
| 8,570,128 B1 | 10/2013 | Dede et al. | | |
| 2005/0263390 A1* | 12/2005 | Gung | .................... | C23C 14/046 204/192.17 |
| 2006/0152162 A1* | 7/2006 | Madocks | .............. | H01J 27/146 315/111.21 |
| 2008/0129292 A1* | 6/2008 | Leussler | .......... | G01R 33/34046 324/318 |
| 2011/0312499 A1* | 12/2011 | Vaughan | ................ | A61B 5/055 505/162 |
| 2012/0217965 A1* | 8/2012 | Vester | ................ | G01R 33/3415 324/307 |
| 2013/0003245 A1 | 1/2013 | Banerjee et al. | | |

(Continued)

OTHER PUBLICATIONS

Aydin, K. et al. "Capacitor-Loaded Split Ring Resonators as Tunable Metamaterial Components." Journal of Applied Physics 101, 024911 (2007), pp. 1-5.

(Continued)

*Primary Examiner* — Jared Fureman
*Assistant Examiner* — Esayas Yeshaw
(74) *Attorney, Agent, or Firm* — Dinsmore & Shohl LLP

(57) ABSTRACT

A magnetic field shield having a plurality of tunable resonant loops arranged on a planar support medium. The resonant loops are loaded with a lumped component such as a capacitor or variable capacitor and produce magnetic null points. The location of the magnetic null points may be moved three dimensionally about the planar support medium.

14 Claims, 10 Drawing Sheets

(56) References Cited

U.S. PATENT DOCUMENTS

| | | |
|---|---|---|
| 2013/0038147 A1 | 2/2013 | Dede et al. |
| 2014/0028425 A1 | 1/2014 | Dede et al. |
| 2015/0101352 A1* | 4/2015 | Kwak ................. H05K 7/2039 62/3.1 |

OTHER PUBLICATIONS

Aydin, Koray et al., "Investigation of Magnetic Resonances for Different Split-Ring Resonator Parameters and Designs." New Journal of Physics 7 (2005) 168. PII: 51367-2630(05)97257-1, pp. 1-15.

Azadifar, Mohammad et al., "Shielding Effectiveness Evaluation of a Loaded Perforated Enclosure by Hybrid FDFD-MoM." 2013 IEEE International Symposium of Electromagnetic Compatibility (EMC), pp. 167-170.

Banerjee, Debasish et al., "Kilohertz magnetic field focusing in a pair of metallic periodic-ladder structures." Applied Physics Letters 99, 093501 (2011); doi: 10.1063/1.3629992.

Choi, Jaewon et al., "Broadband VCO Using Tunable Metamaterial Transmission Line with Varactor-loaded Split-ring Resonator." Progress in Electromagnetics Research Symposium, Hangzhou, China, Mar. 24-28, 2008, pp. 799-803.

Dede, Ercan M. et al., "Kilohertz magnetic field focusing and force enhancement using a metallic loop array." Applied Physics Letters 101, 023506 (2012); doi: 10.1063/1.4737003.

Lee, S.-W. et al., "Quasi-Static Analysis of Materials With Small Tunable Stacked Split Ring Resonators." Progress in Electromagnetics Research, PIER 51, pp. 219-229, (2005).

Lim, Ho et al., "A Tunable Notch Resonator Based on Varactor-Loaded Complementary Split-Ring Resonators." International Workshop on Antenna Technology: Small Antennas and Novel Metamaterials, (Mar. 2008), pp. 426-429.

Radchenko, Andriy et al., "Sheet Absorbing Material Modeling and Application for Enclosures." 2013 IEEE International Symposium on Electromagnetic Compatibility (EMC), pp. 645-650.

Shadrivov, Iiya V. et al., "Tunable Split-Ring Resonators for Non-linear Negative-Index Metamaterials." Optics Express, Oct. 2, 2006, pp. 9344-9349, vol. 14, No. 20.

Wiltshire, M.C.K. et al., "Dispersion characteristics of magneto-inductive waves: comparison between theory and experiment." Electronics Letters, Jan. 23, 2003, vol. 39, No. 2, pp. 215-217.

* cited by examiner

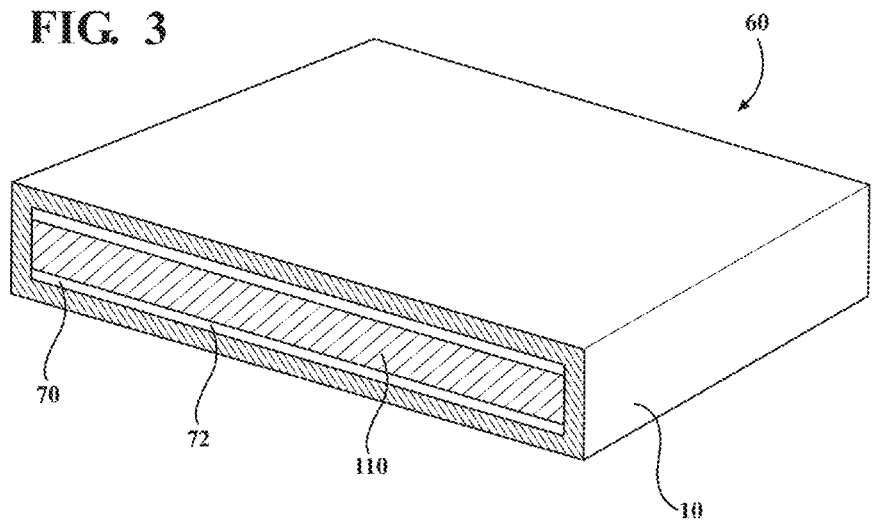
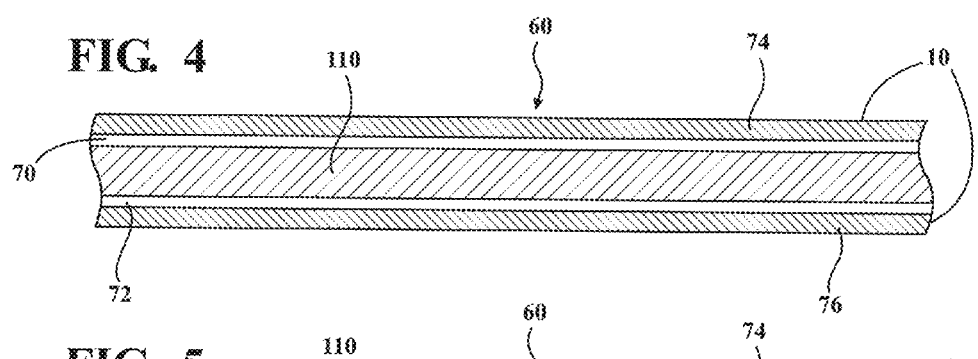
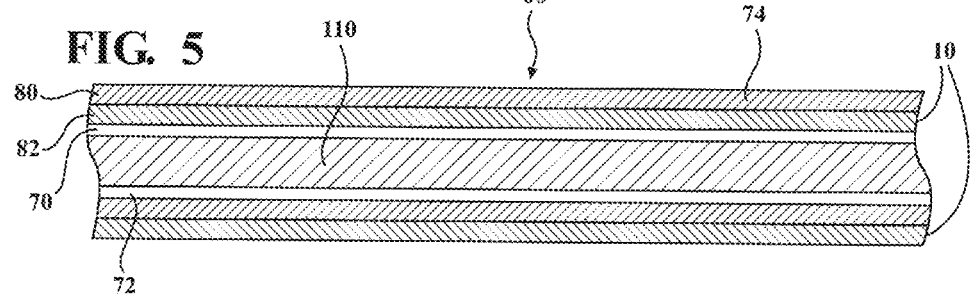

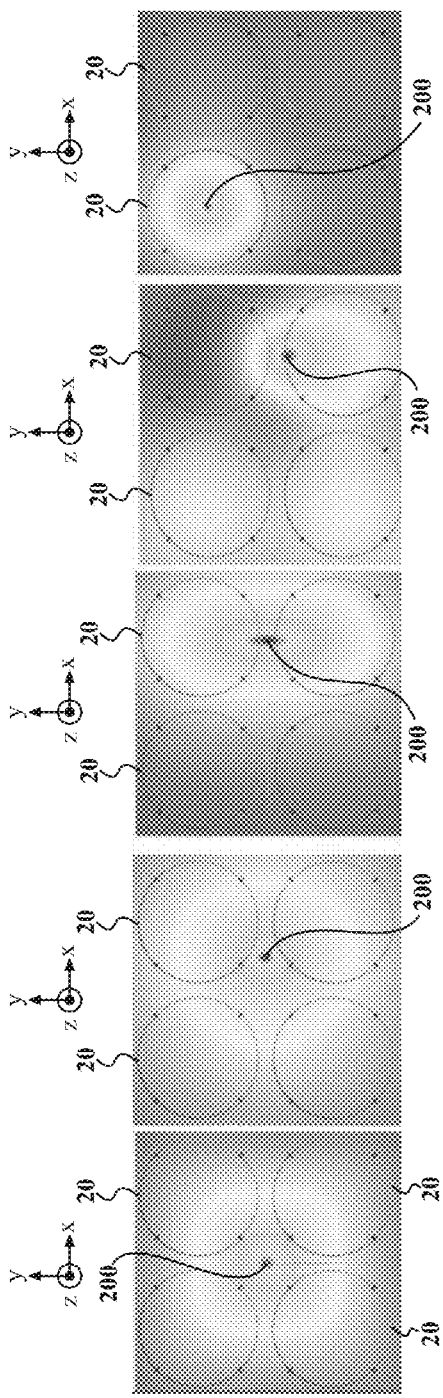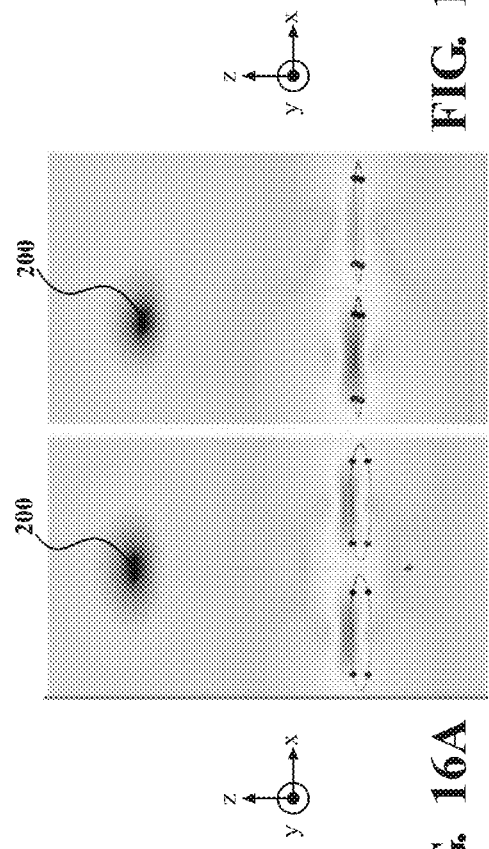

MAGNETIC FIELD SHIELD

FIELD OF THE INVENTION

The invention relates to a magnetic shield, in particular a resonant magnetic shield that generates null points.

BACKGROUND OF THE INVENTION

Electromagnetic interference is a disturbance that negatively impacts electronic components and circuitry due to an electromagnetic radiation, i.e. a magnetic field, from an external source. In addition to natural electromagnetic radiation, a significant source of external magnetic fields are electronics found in many objects and devices including automobiles, cellular phones, and computers.

Electromagnetic shielding is a common practice in which a barrier of a conductive or magnetic material is used in an enclosure or housing to isolate electronic components from unwanted electromagnetic interference. Electromagnetic shielding can further be applied to prevent electronic components enclosed within the shield from emitting electromagnetic radiation and contributing to an external magnetic field seen by another electronic component. Typical shielding materials include sheet metal, metal coatings applied to a surface, or fine metal screens.

A modern automobile has many discrete electronic components and systems located in various positions throughout the automobile. Exemplary systems include electronic control units (ECUs) for engine control, transmission control, chassis control, passenger comfort systems, and infotainment systems. These ECUs are often enclosed within housings formed from plastics or resins.

As more ECUs are used throughout the automobile, there is an increased need for effective magnetic shielding to prevent unwanted magnetic fields generated by these electronic systems from negatively impacting system performance. However, traditional shielding materials are comparatively heavy relative to the housing material and add significant weight when used throughout an automobile.

Electromagnetic radiation is also generated at specific points on an ECU board. For example, a transformer or other lumped component on the ECU board may generate a significant magnetic field while the remainder of the ECU board generates an insignificant amount of electromagnetic radiation. However, traditional magnetic shields are unable to target specific sources of electromagnetic radiation within the housing and must be applied throughout the entire housing to be effective.

It would therefore be useful to shield unwanted magnetic fields by altering the spatial distribution of a magnetic field emitted by a source with a lightweight magnetic field shield incorporated into a housing for an electronic component.

SUMMARY OF THE INVENTION

A preferred embodiment of a magnetic field shield includes a planar support medium with a plurality of tunable resonant loops disposed on the planar support medium. Each of the tunable resonant loops includes at least one lumped component such as a capacitor. An external magnetic field induces a loop current in each of the tunable resonant loops. The loop currents in turn produce at least one magnetic null point outside of the planar support medium.

The size and location of the magnetic null points is movable three dimensionally about the magnetic field shield by tuning the resonant loops. The resonant loops are tunable, for example, by adjusting the radius of the loops, the arrangement of the loops on the planar substrate, and the properties of the lumped component included with each loop.

In another preferred embodiment, the lumped component included with each loop is a variable capacitor. A low voltage electrical control signal is supplied to each variable capacitor to vary the capacitive value of the variable capacitor and tune the resonant loop.

Magnetic field shields according the preferred embodiments are used shield electronic components by producing magnetic null points. Example applications include magnetic field shields for ECU housings and the like.

BRIEF DESCRIPTION OF THE DRAWINGS

FIG. 3 shows a cross-sectional view of a housing for an electronic component having the magnetic field shield;

FIG. 4 shows a preferred embodiment of the housing of FIG. 3;

FIG. 5 shows another preferred embodiment of the housing of FIG. 3;

FIG. 15A shows the locations of magnetic null points in the x-y plane corresponding to the different loop currents shown in FIG. 14 and illustrating a simulated null point resulting from the set of currents A in FIG. 14;

FIG. 15B shows the locations of magnetic null points in the x-y plane corresponding to the different loop currents shown in FIG. 14 and illustrating a simulated null point resulting from the set of currents B in FIG. 14;

FIG. 15C shows the locations of magnetic null points in the x-y plane corresponding to the different loop currents shown in FIG. 14 and illustrating a simulated null point resulting from the set of currents C in FIG. 14;

FIG. 15D shows the locations of magnetic null points in the x-y plane corresponding to the different loop currents shown in FIG. 14 and illustrating a simulated null point resulting from the set of currents D in FIG. 14;

FIG. 15E shows the locations of magnetic null points in the x-y plane corresponding to the different loop currents shown in FIG. 14 and illustrating a simulated null point resulting from the set of currents E in FIG. 14;

FIG. 16A shows the location of magnetic null points in the z-direction and adjusted or moved in the x-direction and illustrating a magnetic null point spaced apart from resonant loops in the z-direction;

FIG. 16B shows the location of magnetic null points in the z-direction and adjusted or moved in the x-direction and illustrating a magnetic null point moved in the x-direction;

DETAILED DESCRIPTION OF THE PREFERRED EMBODIMENTS

A magnetic field shield that provides an efficient and lightweight shielding device for low frequency (1 KHz-100 MHz) electromagnetic radiation is disclosed. The magnetic field shield has a plurality of tunable resonant loops disposed on a planar support medium that may easily be incorporated into housings for electrical components, such as those used for automobile ECUs. Each of the resonant loops are loaded with a lumped component, such as a capacitor or variable capacitor, which allows the resonant loops to be tuned. The magnetic field shield produces magnetic null points that are three dimensionally movable by tuning the resonant loops to target specific points surrounding the magnetic field shield.

Structural Arrangement

Figure 1:
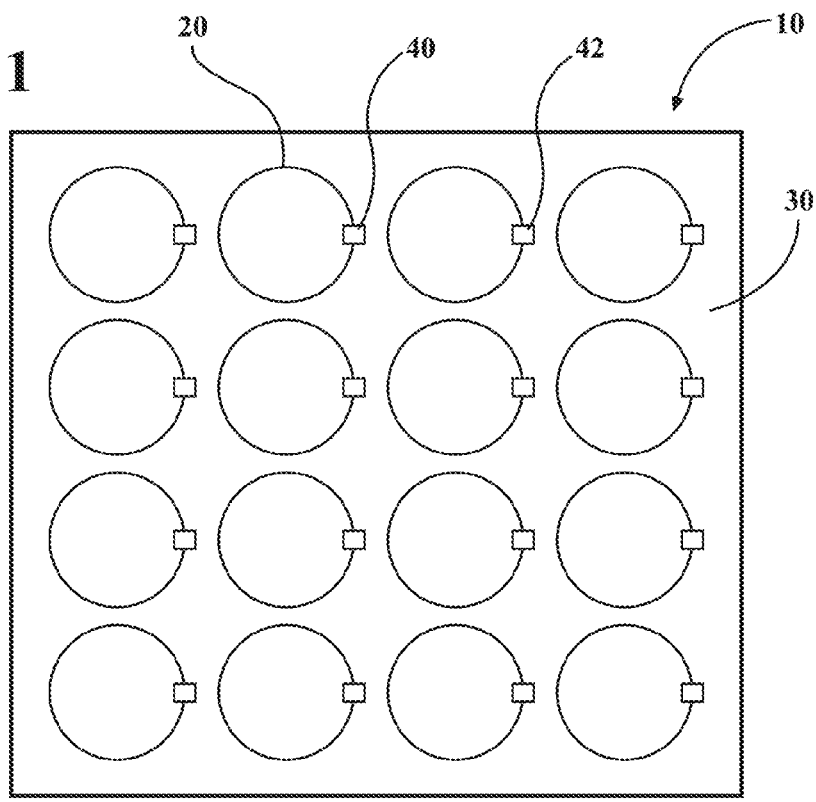
FIG. 1 is a schematic illustration of a preferred embodiment of a magnetic field shield.
Figure 2:
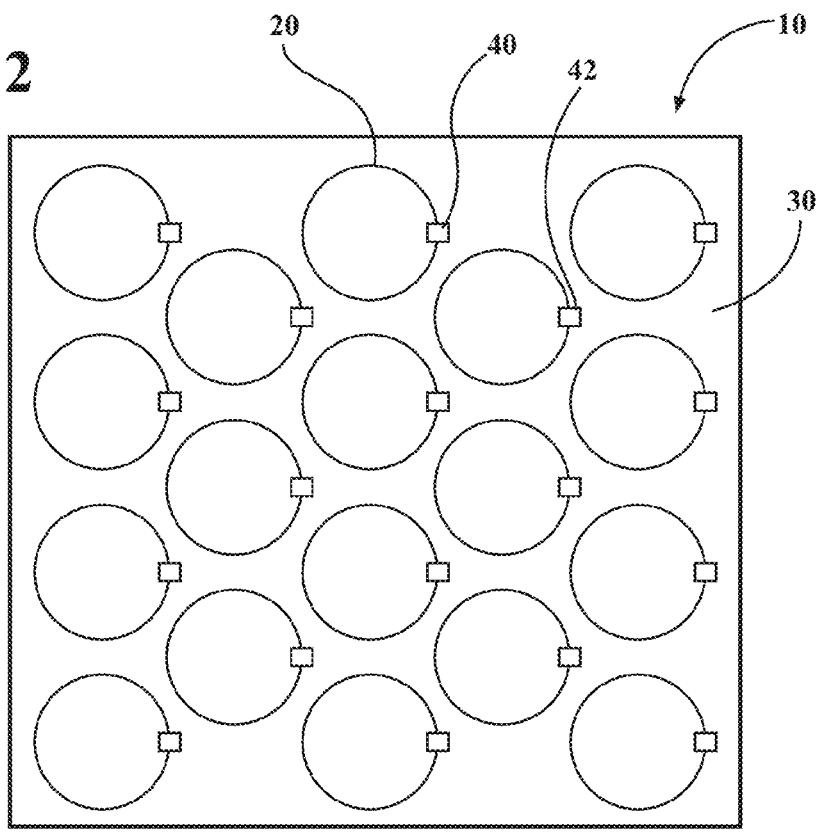
FIG. 2 illustrates another preferred embodiment of the magnetic field shield.

Turning now to FIG. 1, a preferred embodiment has a magnetic field shield 10 with a plurality of tunable resonant loops 20 disposed on a planar support medium 30. Each of the tunable resonant loops 20 includes at least one lumped component 40. As shown in FIG. 1, the resonant loops 20 have a single lumped component 40 and are arranged on the planar support medium 30 in a regular grid arrangement. However, in another preferred embodiment shown in FIG. 2, the resonant loops 20 are arranged on the support medium 30 in an offset grid arrangement.

Since the magnetic field shield 10 is for low frequency (1 KHz-100 MHz) electromagnetic radiation, the resonant loops 20 have an operating frequency within the range from 1 KHz-100 MHz. One way of tuning the operating frequency of the resonant loops 20 is by adjusting the radius of the loops 20. In a preferred embodiment, the radius of the loops 20 is within a range from 30 millimeters (mm) to 50 mm, e.g. 40 mm. However, one skilled in the art will appreciate that an operating frequency outside of the preferred range may be obtained by adjusting the radius of the loops 20 to a radius outside of the preferred range.

Figure 7:
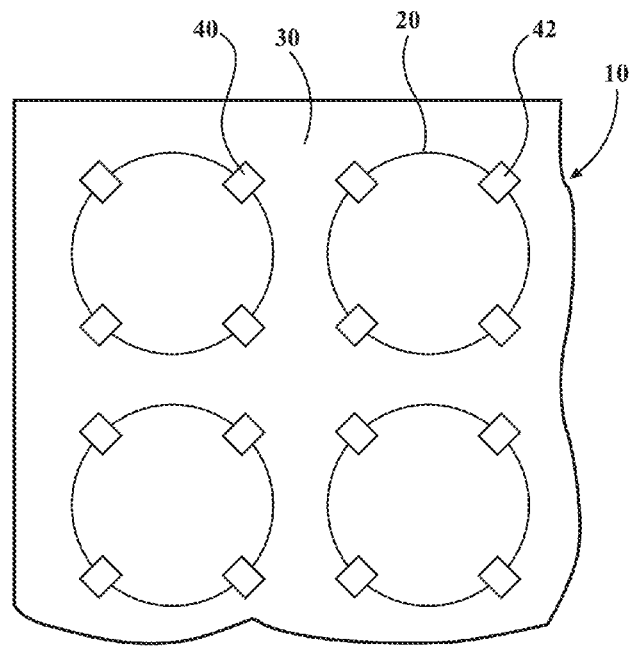
FIG. 7 shows a preferred embodiment of the resonant loops having a plurality of lumped components.

The operating frequency of the resonant loops 20 is also tuned by adjusting the properties of the lumped component 40 loaded on the resonant loops 20. In a preferred embodiment, the resonant loops 20 are loaded with a capacitor 42 having a capacitance in the range from 1 nanofarad to 10 nanofarad. In this preferred embodiment, the resonant loops 20 are loaded with a single lumped component that is depicted in a uniform position of the resonant loops 20 throughout the exemplary magnetic field shield 10, however this is not required. In another preferred embodiment shown in FIG. 7, the resonant loops 20 are loaded with multiple lumped components 40 that are arranged about the circumference of the resonant loops 20.

Figure 8:
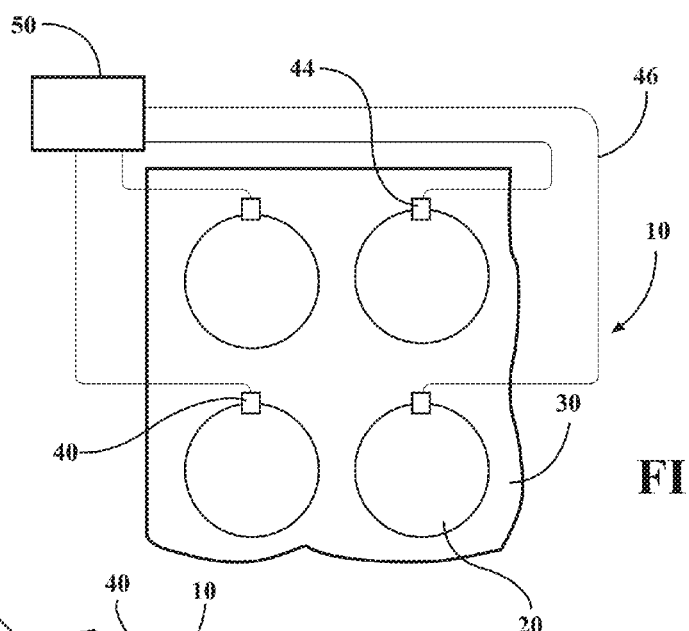
FIG. 8 shows a preferred embodiment of the resonant loops loaded with variable capacitors.

In another preferred embodiment, the resonant loops are loaded with variable capacitors 44 that have capacitive values that are controllable throughout a capacitive range as illustrated in FIG. 8. In this preferred embodiment, the variable capacitor 44 has a capacitance in the range from 1 nanofarad to 10 nanofarad. The capacitance of the variable capacitor 44 is adjusted using an electrical control signal that is supplied directly to the variable capacitor 44 via a control circuit 50 by a trace 46 on the planar support medium 30, or as otherwise required by the variable capacitor 44. As with the radius of the loops 20, one skilled in the art will appreciate that an operating frequency outside of the preferred range may be obtained by adjusting the capacitance outside of the preferred range.

The planar support medium 30 and the resonant loops 20 are preferably incorporated into a housing 60 as shown in FIG. 3 for an electronic component. In some instances, the planar support medium 30 is a dielectric substrate.

The housing 60 has a housing body 70 as shown in FIG. 3. The housing body 70 defines an interior volume 72 with an electronic component 100, for example an ECU board 110, disposed within the interior volume 72. The resonant loops 20 are preferably positioned to be planarly parallel with and spaced apart from a surface of the ECU board 110.

A cross sectional view of the preferred housing 60 having the magnetic field shield 10 is shown in FIG. 4. The ECU board 110 is disposed within the interior volume 72 of the housing body 70 and the magnetic field shield 10 is positioned on a first housing side 74 and an optionally opposite second housing side 76. In this preferred embodiment, the magnetic field shield 10 has a single layer of resonant loops 20 planarly arranged on the first housing side 74 and/or second housing side 76.

Figure 6:
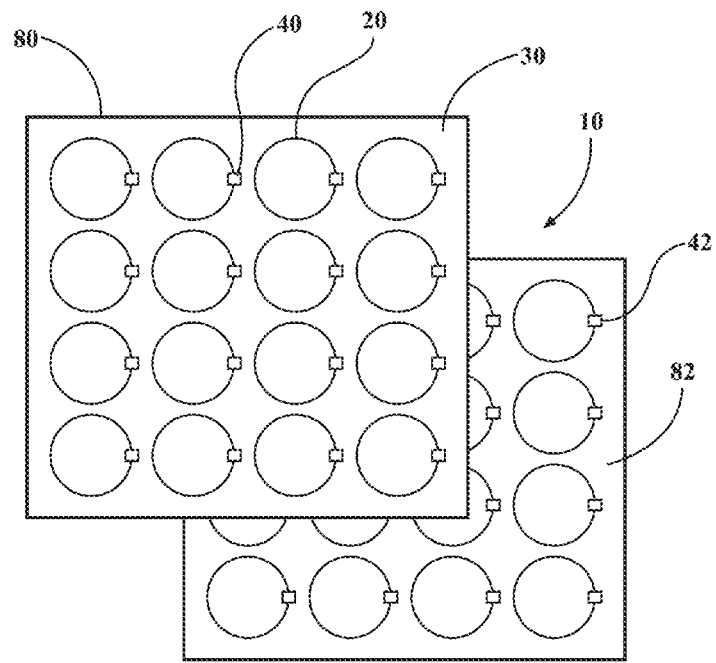
FIG. 6 shows an exemplary arrangement of the magnetic field shield of FIG. 1.

In another preferred embodiment shown in FIGS. 5 and 6, the magnetic field shield 10 has a first layer of resonant loops 80 and a second parallel layer of resonant loops 82. Stated differently, the planar support medium 30 has two parallel layers 80, 82 of resonant loops 20 arranged within the thickness of the support medium 30. As such, when utilized in a housing body 70, the first housing side 74 and/or the opposite second housing side 76 each have two layers of resonant loops 20.

Operation and Location of Null Points

Figure 9A:
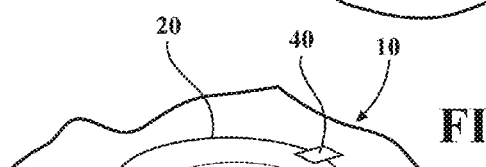
FIG. 9A illustrates an exemplary interaction between a magnetic field from an electronic component and a magnetic field shield with a resonant loop.
Figure 9B:
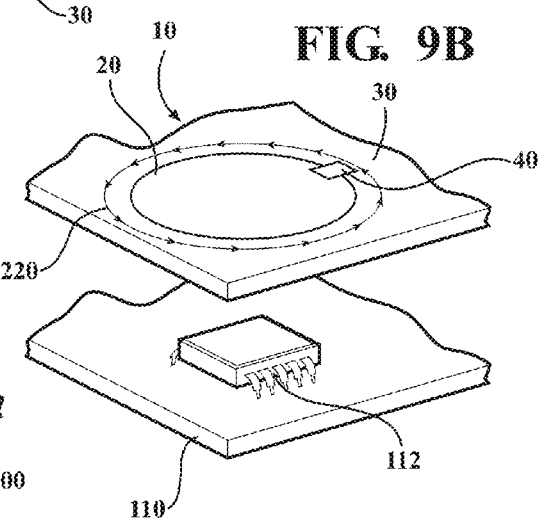
FIG. 9B shows an exemplary interaction between a magnetic field and a resonant loop illustrating an induced loop current in the resonant loop.
Figure 9C:
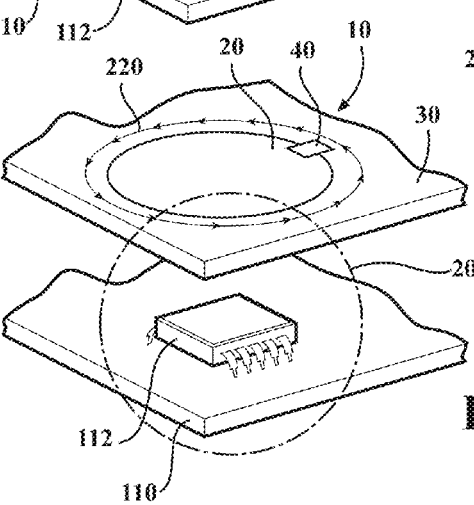
FIG. 9C shows an exemplary interaction between a magnetic field and a resonant loop illustrating a magnetic null point generated by the loop current.

The magnetic field shield 10 shields electronic components by producing at least one magnetic null point 200 as shown in FIG. 9C. As depicted in FIGS. 9A-9C, a magnetic field 210 from an electronic component 112 induces a loop current 220 in the resonant loop 20. The loop current 220 in turn generates a magnetic null point 200. The size and location of the magnetic null point 200 is controlled by adjusting the properties of the resonant loops 20 within the magnetic field shield 10. These adjustable properties include the size of the resonant loop 20, the capacitance of the lumped component 40, and the arrangement of the resonant loops 20 on the planar support medium 30. While only one resonant loop 20 is depicted in FIGS. 9A-9C, it is appreciated that the resonant loops 20 in the area around the depicted resonant loop 20 respond in a similar manner and contribute to the magnetic null point 200, the interaction of which will be described below.

Figure 10:
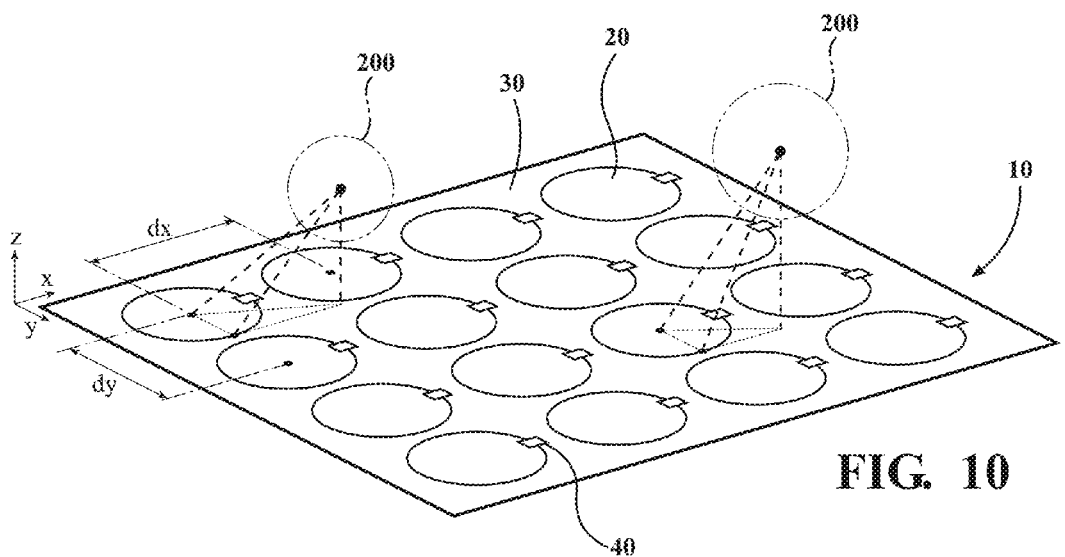
FIG. 10 shows a perspective view of the magnetic field shield and the formation of magnetic null points.

An exemplary section of the magnetic field shield 10 is shown generally in FIG. 10. Throughout the explanation, reference is made to the coordinate axis and the x-direction, y-direction, and z-direction. It is appreciated that the x-direction and the y-direction extend along the planar support medium 30 and that the z-direction extends normally from the surface of the planar support medium 30.

In the preferred embodiment, centers of adjacent resonant loops 20 are spaced apart in the x-direction by a distance dx and in the y-direction by a distance dy. It is appreciated that when the resonant loops 20 are arranged in a regular grid, the distances dx and dy between dx and dy will vary as the arrangement of the resonant loops 20 on the support medium 30 changes.

In a preferred embodiment, the magnetic null points 200 are located approximately 50-150 mm away from the magnetic field shield 10 in the z-direction. As such, in the preferred embodiment a spacing distance between the ECU board 110 and the magnetic field shield 10 falls within the 50-150 mm range to allow the magnetic null points 200 to target components 112 on the ECU board 110.

The location of the magnetic null points 200 is controllable in three dimensions, i.e. in the x-direction, y-direction, and z-direction. The control of the magnetic null point 200 will be described first in the z-direction (Vertical) and then in the xy-direction (Planar). An experimental trial will be used to demonstrate the control of the magnetic null point 200 followed by an analytical model to position the magnetic null point 200. The results of the experimental trial are in agreement with the analytical model and, as such, one skilled in the art will appreciate that the analytical model may be used to freely position magnetic null points 200 about the magnetic field shield 10 in three dimensional space.

Experimental Trial

Not being bound by theory, an incoming magnetic field 210 will induce a loop current 220 in each of the resonant loops 20, which will in turn produce a magnetic field about the magnetic field shield 10. The loop current 220 is further altered by the lumped component 40, such as a capacitor 42 or variable capacitor 44.

Figure 11A:
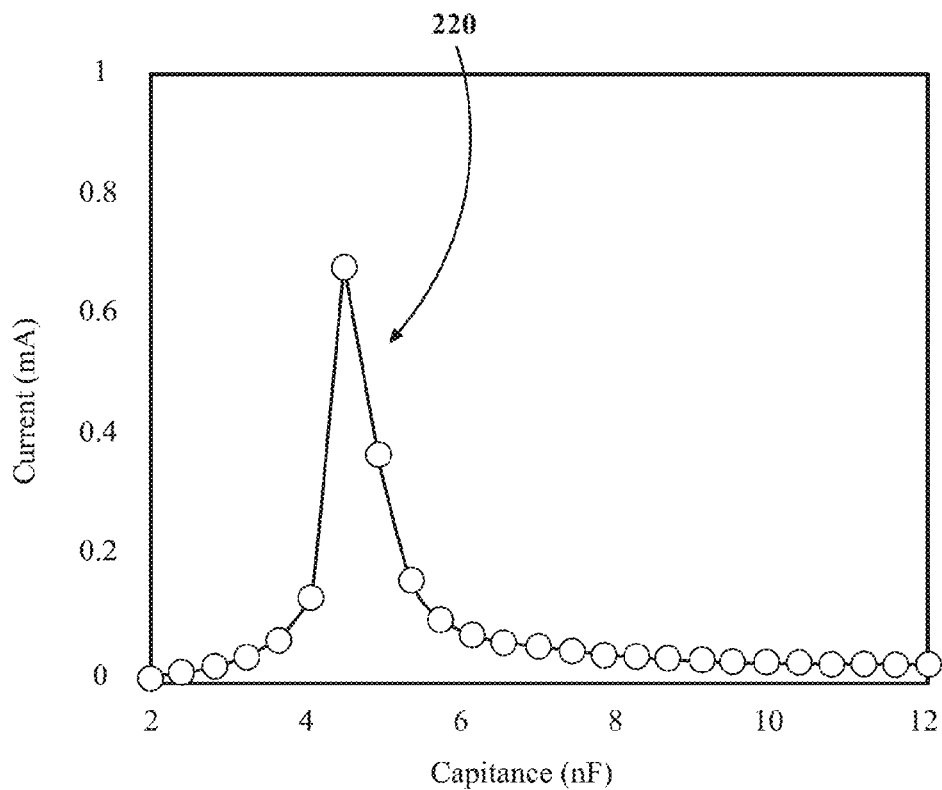
FIG. 11A shows experimental data gathered from an exemplary resonant loop illustrating calculated loop current versus capacitance.
Figure 11B:
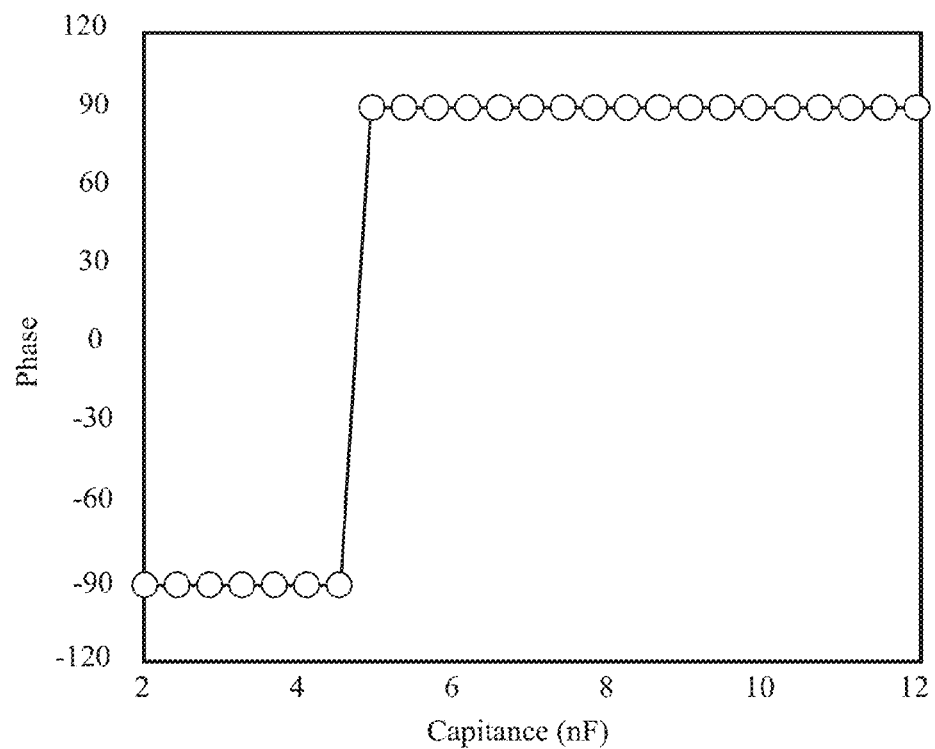
FIG. 11B shows experimental data gathered from an exemplary resonant loop illustrating phase versus capacitance.

FIGS. 11A and 11B show a calculated loop current 220 and phase of a resonant loop 20 loaded with a capacitor 42, respectively, placed in a 10 MHz magnetic field 210. The phase represents the direction of the loop current 220. The graphs depict how the loop current 220 and the phase change as the capacitance of the capacitor 42 is altered. As shown, the loop current 220 reaches a peak when the capacitance is 4.3 nF. The phase also changes and reverses direction when the capacitance is 4.3 nF. A phase of negative 90 represents an induced magnetic field in the direction of the incoming magnetic field 210. Conversely, a phase of positive 90 represents an induced magnetic field in a direction opposite to the incoming magnetic field 210.

Figure 11C:
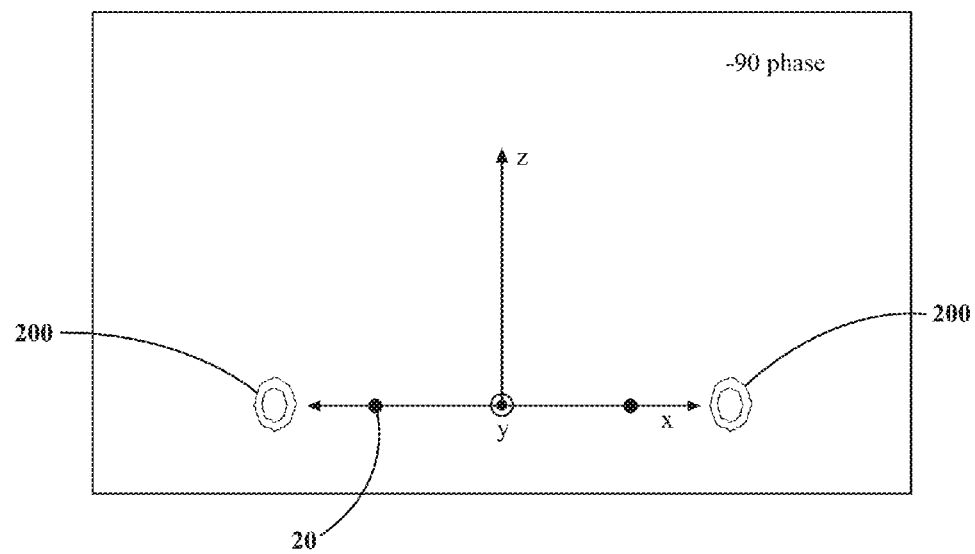
FIG. 11C shows experimental data gathered from an exemplary resonant loop illustrating location of a magnetic null point for a negative phase.
Figure 11D:
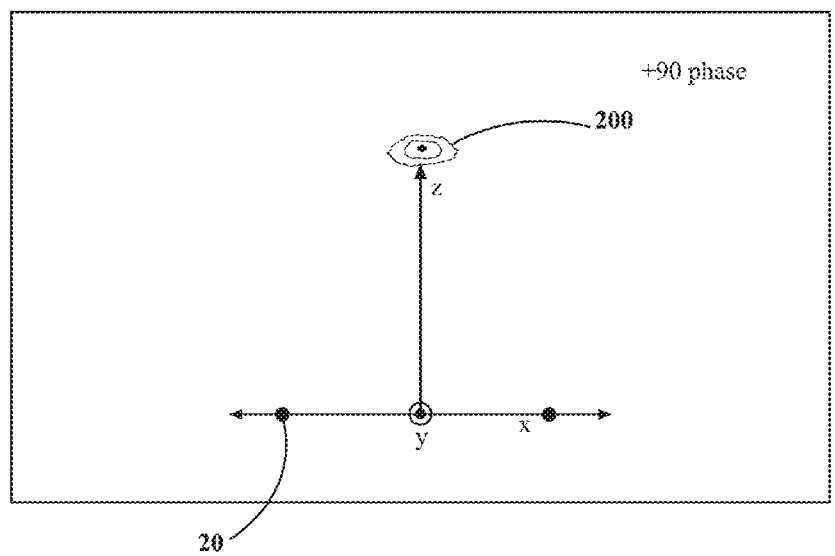
FIG. 11D shows experimental data gathered from an exemplary resonant loop illustrating location of a magnetic null point for a positive phase.

FIG. 11C shows the location of the magnetic null point 200 in the x direction in relation to the phase of the loop current 220 when the phase is −90 and FIG. 11D illustrates the location of the null point 200 in the z direction for a +90 phase. As such, it is appreciated that a positive phase is need in order to produce a magnetic null point 200 in the z-direction away from the magnetic field shield 10, i.e. out of the plane of the shield 10.

Figure 12:
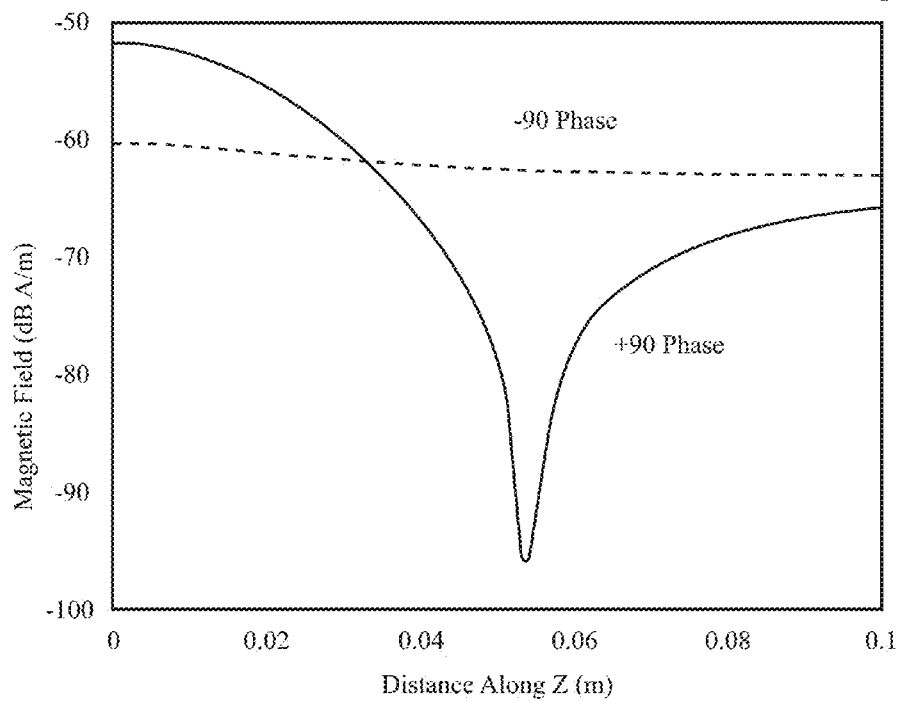
FIG. 12 shows experimental data gathered from an exemplary resonant loop.

FIG. 12 shows the field distribution of the two loop current phases 220 from the center of the resonant loop 20 (z=0) along the z-direction. When the capacitance is 1.26 nF the magnetic null point 200 is 50 mm from the loop 20 at an operating frequency of 10 MHz. By adjusting the capacitance, the location of the magnetic null point 200 in the z-direction can be controlled. Furthermore, the 10 MHz magnetic field 210 is significantly reduced at the magnetic null point 200.

Having described how adjusting the capacitance is used to position the magnetic null point 200 in the z-direction using experimental data, the control of the magnetic null point 200 in the xy-direction will now be described.

Figure 13:
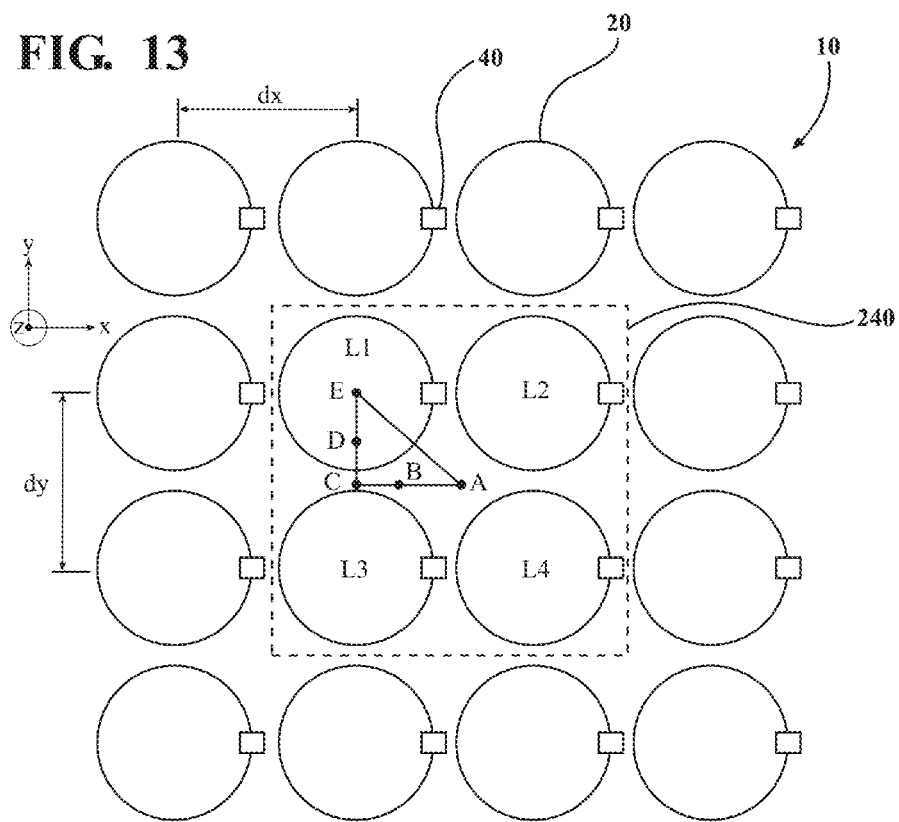
FIG. 13 shows an exemplary arrangement of resonant loops and a magnetic null point formed in various positions.

With reference now to FIG. 13, an outlined four resonant loop array 240 is shown. Points A, B, C, D, and E define a triangle and the four resonant loops, loops L1, L2, L3, and L4, of the outlined array 240 are used to locate the magnetic null point 200 at these specific points in the xy-direction.

Figure 14:
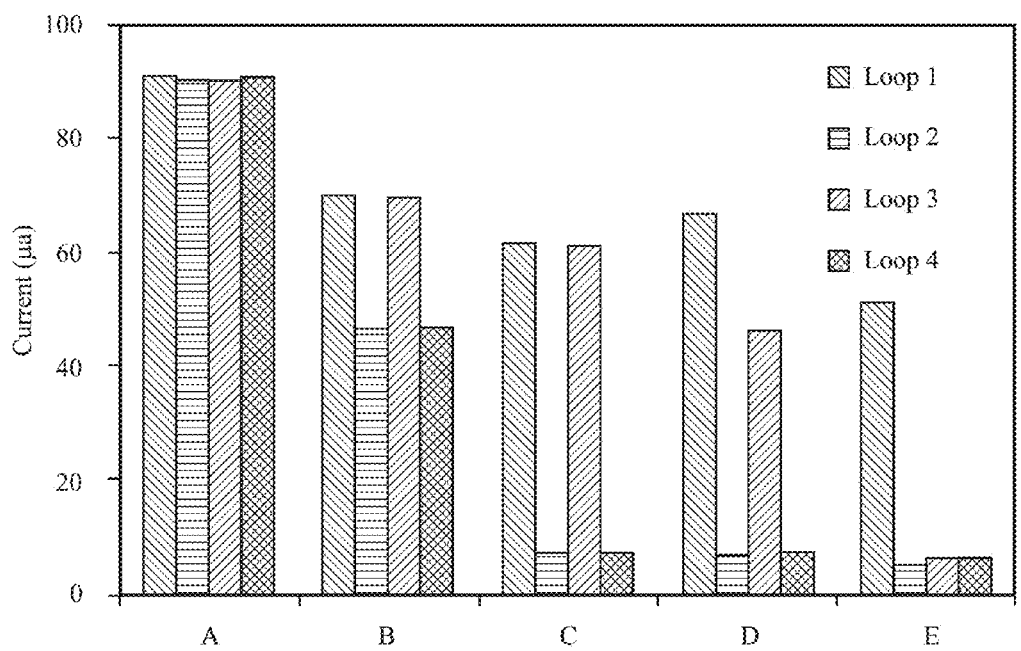
FIG. 14 shows the loop current induced in the resonant loops from FIG. 13 when the magnetic null point is at various positions.

The location of the magnetic null point 200 in the xy-direction is controlled by changing the capacitance of the four loops within the outlined array 240 relative to one another. FIG. 14 depicts the current in the loops L1-L4 as the magnetic null point 200 is moved from Point A to Point D. As discussed above, the capacitance of the resonant loops 20 is related to the loop current 220 shown in FIG. 14. The loop current 220 is shown in FIG. 14 because the loop current 220 varies over a greater range than the capacitance of the loop 20 and is therefore easier to depict.

Point A is equidistant from the centers of loops L1, L2, L3, and L4. As such, for the magnetic null point 200 to be located at point A, the loop currents 220 of all the loops is the same. To locate the magnetic null point 200 at Point B, the loop current 220 in loops L2 and L4 is reduced relative to the loop currents 220 in loops L1 and L3. As the magnetic null point 200 moves towards Point C which is closest to loops L1 and L3, the loop currents 220 in loops L2 and L4 continues to decrease and remains comparatively small.

One skilled in the art will appreciate that as the magnetic null point 200 moves about symmetrically relative to the loops L1-L4, the loop currents 220 are similarly changed in pairs. However, as the magnetic null point 200 moves towards Point D, the loop current 220 in loop L3 is reduced relative to loop L1. Finally, to position the magnetic null point 200 at Point E, the loop current 220 in loop L1 is appreciably greater than the loop current 220 in any of the other loops L2-L4.

FIG. 15 illustrates simulated null points generated by loops L1-L4 shown in FIG. 13 and the current shown in FIG. 14. In particular: FIG. 15A is the simulated null point 200 resulting from the set of currents A in FIG. 14; FIG. 15B is the simulated null point 200 resulting from the set of currents B in FIG. 14; FIG. 15C is the simulated null point 200 resulting from the set of currents C in FIG. 14; FIG. 15D is the simulated null point 200 resulting from the set of currents D in FIG. 14; and FIG. 15E is the simulated null point 200 resulting from the set of currents E in FIG. 14. In addition, FIGS. 16A and 16B illustrate that the magnetic null point 200 can be spaced apart from the loops 20 (z-direction) and also moved in the x- (and y) direction. As such, a magnetic null point can be located and moved to a desired location/position in three dimensional space using one or more embodiments disclosed herein.

As described above, the location of the magnetic null point 200 is in part dictated by the geometric arrangement of the resonant loops 20 on the support medium 30. Each of the plurality of tunable resonant loops 20 can therefore be considered individual units that are arranged according to design specifications. In the preferred embodiments described above, the resonant loops 20 are arranged on the support medium 30 in a regular grid, as in FIG. 1, and an offset grid, as in FIG. 2. One skilled in the art will however appreciate that the arrangement of the resonant loops 20, or unit cells, on the support medium 30 can be modified without departing from the scope of the present magnetic field shield 10. For example, the resonant loops 20 may not be uniformly arranged throughout the entire planar support medium 30.

The radii of the resonant loops 20 and the capacitance of the lumped components 40 loaded on the resonant loops 20 further provides two degrees of freedom for tuning the operating frequency of the resonant loops 20 and the location of the magnetic null points 200. As such, and while in a preferred embodiment all the resonant loops 20 have the same radius and are loaded with the same lumped component 40, one skilled in the art will appreciate that by varying the radius and lumped component 40 of the magnetic field shield 10, the operating frequency of the resonant loops 20 can be adjusted. Furthermore, tuning the resonant loops 20 in this manner will alter the properties of the magnetic null points 200, as described above.

Analytically Calculating the Null Point Formation

In an effort compare control and location of magnetic null points via numerical and analytical methods, an analytical solution to the location of a magnetic null point was derived and is discussed below.

For cylindrical coordinates, a single loop expression for a magnetic field (H) along the $\hat{\gamma}$ and $\hat{z}$ direction is given by:

$$\vec{H} = H_\gamma \hat{\gamma} + H_z \hat{z} \quad (1)$$

where $H_\gamma$ is the magnetic field component in the $\gamma$ direction and $H_z$ is the magnetic field component in the z direction. In addition:

$$H_\gamma = \frac{\mu_o R I}{2} \int_0^\alpha \lambda J_1(\lambda R) J_1(\lambda \gamma) e^{-F_0 Z} d\lambda \quad (2)$$

and:

$$H_z = \frac{\mu_o R I}{2} \int_0^\alpha \frac{\lambda^2}{F_0} J_1(\lambda R) J_2(\lambda \gamma) e^{-F_0 Z} d\lambda + \frac{\mu_o R I}{2} \int_0^\alpha \frac{2}{\gamma} \frac{\lambda}{F_0} J_1(\lambda R) J_1(\lambda \gamma) e^{-F_0 Z} d\lambda \quad (3)$$

$$= \frac{\mu_o R I}{2} \left[ \int_0^\alpha \frac{2}{\gamma} \frac{\lambda}{F_0} J_1(\lambda R) J_1(\lambda \gamma) e^{-F_0 Z} d\lambda - \int_0^\alpha \frac{\lambda^2}{F_0} J_1(\lambda R) J_2(\lambda \gamma) e^{-F_0 Z} d\lambda \right]$$

and $F_0 = \sqrt{\lambda^2 - \chi_0^2}$ $$\chi_0 = \frac{w}{c}, \quad w = 2\lambda f,$$

$\mu_o$=permeability of air;
R=radius of the loops;
I=loop current;
$\lambda$=wavelength;
$J_1$=Bassel function of order 1;
$J_2$=Bassel function of order 2;
Z=distance from the loop along z-direction;
$\alpha$=infinity;
w=velocity of magnetic wave;

c=speed of light; and
f=frequency.

For a null condition at $(\gamma_0, Z_0)$ $$H_{1\gamma} = H_{2\gamma} \quad (4)$$

$$H_{1Z} \pm H_{2Z} = Hoin \quad (5)$$

and assuming: $Z = Z_0 = 0.03$, then from condition (4):

$$\frac{I_1}{I_2} = \frac{\int_0^\alpha \lambda J_1(\lambda R_2) J_1(\lambda \gamma_2) e^{-F_0 Z} d\lambda}{\int_0^\alpha \lambda J_1(\lambda R_1) J_1(\lambda \gamma_1) e^{-F_0 Z} d\lambda} \quad (6)$$

$$= \frac{\vartheta_2}{\vartheta_1}$$

Also, assuming $\gamma_1 = \gamma_0$ and $\gamma_2 = R_1 + R_2 + d - \gamma_0$, equation (5) provides:

$$\frac{\mu R I_1}{2} \left[ \int_0^\alpha \frac{2}{\gamma_1} \frac{\lambda}{F_0} J_1(\lambda R_1) J_1(\lambda \gamma_1) e^{-F_0 Z_0} d\lambda - \int_0^\alpha \frac{\lambda^2}{F_0} J_1(\lambda R_1) J_2(\lambda \gamma_2) e^{-F_0 Z_0} d\lambda \right] \pm \quad (7)$$

$$\frac{\mu R I_2}{2} \left[ \int_0^\alpha \frac{2}{\gamma_2} \frac{\lambda}{F_0} J_1(\lambda R_2) J_1(\lambda \gamma_2) e^{-F_0 Z_0} d\lambda - \int_0^\alpha \frac{\lambda^2}{F_0} J_1(\lambda R_2) J_2(\lambda \gamma_2) e^{-F_0 Z_0} d\lambda \right] = Hoin$$

or, $I_1 \phi_1 \pm I_2 \phi_2 = Hoin$ or, $\frac{I_1}{I_2} \phi_1 \pm \phi_2 = \frac{Hoin}{I_2}$ or, $I_2 = \frac{Hoin}{\left(\frac{I_1}{I_2} \phi_1 \pm \phi_2\right)}$ or, $I_2 = \frac{Hoin}{\frac{\vartheta_2}{\vartheta_1} \phi_1 \pm \phi_2}$ $I_2 = \frac{\vartheta_1 Hoin}{\vartheta_2 \phi_1 \pm \phi_2 \vartheta_1}$ which allows for $I_2$ to be solved, i.e.:

$$I_1 = \frac{\vartheta_2}{\vartheta_1} I_2 \quad (8)$$

$$\vartheta_1 = \int_0^\alpha \lambda J_1(\lambda R_1) J_1(\lambda \gamma_1) e^{-F_0 Z_0} d\lambda \quad (9)$$

$$\vartheta_2 = \int_0^\alpha \lambda J_1(\lambda R_2) J_1(\lambda \gamma_2) e^{-F_0 Z_0} d\lambda \quad (10)$$

$$\phi_1 = \frac{M o R_1}{2} \left[ \int_0^\alpha \frac{2}{\gamma_1} \frac{\lambda}{F_0} J_1(\lambda R_1) J_1(\lambda \gamma_1) e^{-F_0 Z_0} d\lambda - \int_0^\alpha \frac{\lambda^2}{F_0} J_2(\lambda R_1) J_2(\lambda \gamma_1) e^{-F_0 Z_0} d\lambda \right] \quad (11)$$

$$\phi_2 = \frac{M o R_2}{2} \left[ \int_0^\alpha \frac{2}{\gamma_1} \frac{\lambda}{F_0} J_1(\lambda R_2) J_1(\lambda \gamma_2) e^{-F_0 Z_0} d\lambda - \int_0^\alpha \frac{\lambda^2}{F_0} J_1(\lambda R_2) J_2(\lambda \gamma_2) e^{-F_0 Z_0} d\lambda \right] \quad (12)$$

Figure 17:
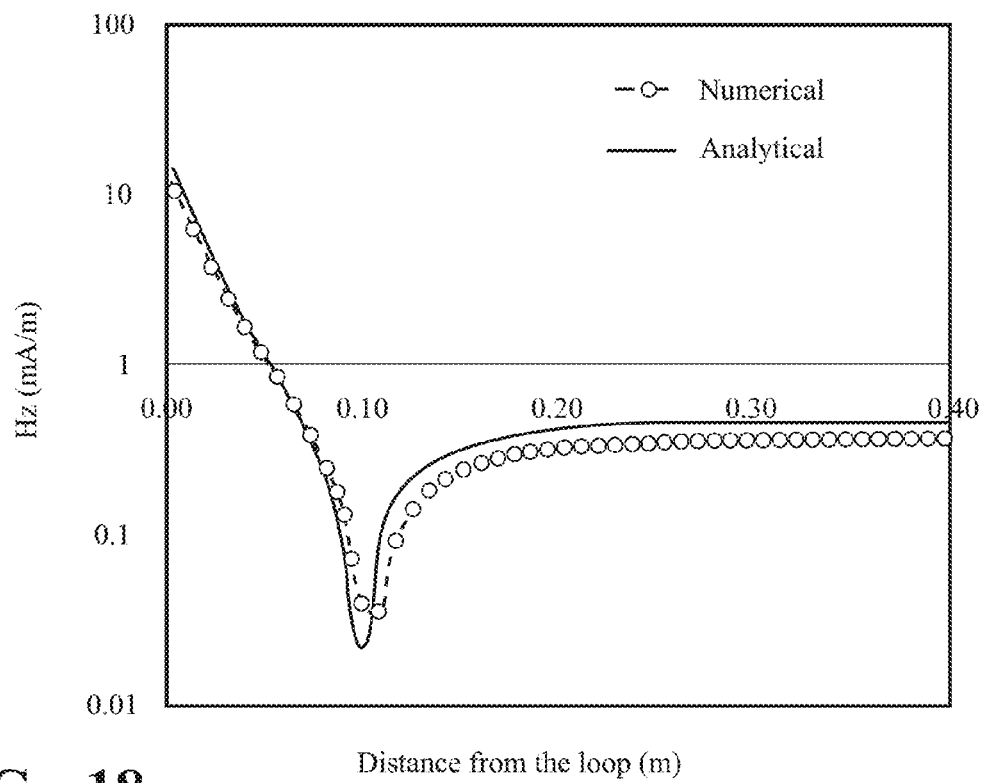
FIG. 17 shows the relation between experimental results and analytical results for the magnetic field strength in the z-direction.
Figure 18:
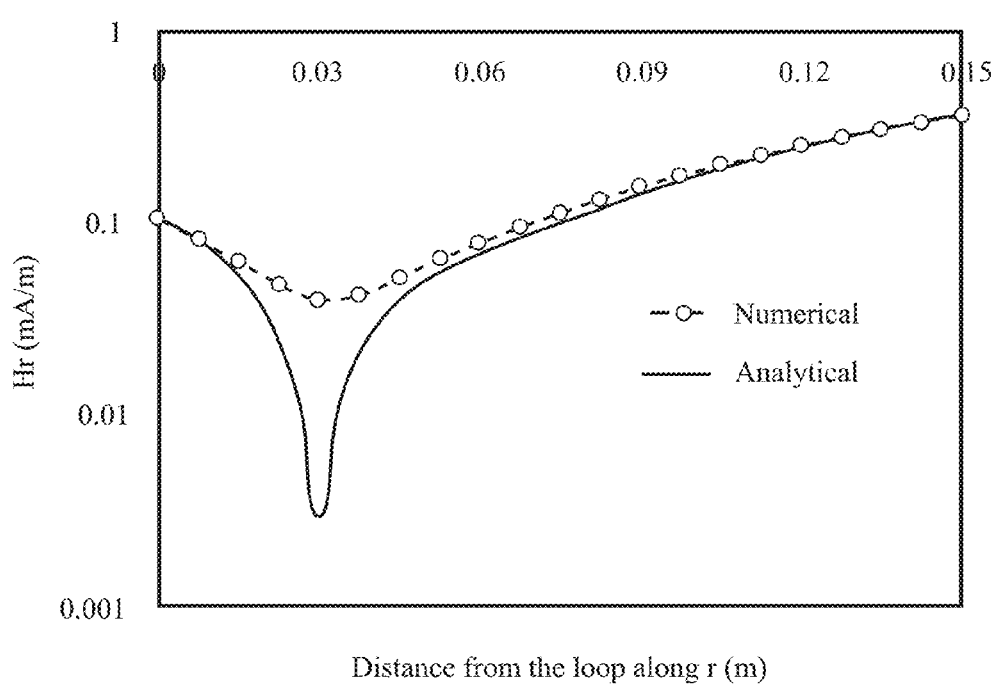
FIG. 18 shows the relation between experimental results and analytical results for the magnetic field strength in the x-direction.

$\gamma_1 = \gamma_0 = 0.02$ m $\gamma_2 = R_1 + R_2 + d - \gamma_0$
$Z_0 = 0.03$ m
$R_1 = 0.04$ m, $R_2 = 0.04$ m
$d = 0.02$ m Referring now to FIGS. 17 and 18, calculation of the magnetic field 210 along the z-direction and the x-direction using analytical and numerical approaches are shown. From the results, it is clear that there is good agreement between the analytical and experimental approach such that the magnetic null points 200 can accurately and repeatedly be located as desired according to design parameters.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

| Reference Numeral Listing | |
| --- | --- |
| 10 | Magnetic field shield |
| 20 | Tunable resonant loops |
| 30 | Planar support medium |
| 40 | Lumped component |
| 41 | Capacitor |
| 44 | Variable capacitor |
| 46 | Trace |
| 50 | Control circuit |
| 60 | Housing |
| 70 | Housing body |
| 72 | Interior volume |
| 74 | First housing side |
| 76 | Second housing side |
| 80 | First layer of resonant loops |
| 82 | Second layer of resonant loops |
| 100 | Electronic component |
| 110 | ECU board |
| 112 | Components |
| 200 | Magnetic null point |
| 210 | Magnetic field |
| 220 | Loop current |
| 240 | Outlined four resonant loop array |

We claim:

1. A magnetic field shield, comprising:
a planar support medium; and
a plurality of tunable resonant loops disposed on said planar support medium and arranged on said planar support medium in a regular grid arrangement or an offset arrangement, each of said plurality of tunable resonant loops having at least one lumped component;
each of said plurality of tunable resonant loops having an induced loop current in response to an external magnetic field, said induced loop currents producing at least one magnetic null point at a point spaced apart from said planar support medium.

2. The magnetic field shield of claim 1, wherein said planar support medium is a dielectric substrate, said plurality of tunable resonant loops being disposed on said dielectric substrate.

3. The magnetic field shield of claim 2, wherein said at least one lumped component is a capacitor.

4. The magnetic field shield of claim 3, further comprising an electrical control signal, said electrical control signal supplied to said at least one lumped component of each of said tunable resonant loops and said at least one lumped component is a variable capacitor having a capacitive value, said electrical control signal varying a capacitive value of each of said plurality of tunable resonant loops.

5. The magnetic field shield of claim 4, wherein said electrical control signal varies said capacitive value of said variable capacitor between 1-10 nanofarad.

6. The magnetic field shield of claim 3, wherein said capacitors of said plurality of tunable resonant loops have a capacitance within a capacitance range between 1-10 nanofarad.

7. The magnetic field shield of claim 1, wherein said plurality of tunable resonant loops are disposed on said planar support medium in a single layer.

8. The magnetic field shield of claim 1, further comprising a first planar layer of tunable resonant loops disposed on said planar support medium and a second planar layer of tunable resonant loops disposed on said planar support medium.

9. The magnetic field shield of claim 1, wherein each of said plurality of tunable resonant loops have an operating frequency within a frequency range from 1 kilohertz (1 KHz) to 100 megahertz (100 MHz).

10. The magnetic field shield of claim 1, wherein each of said plurality of tunable resonant loops have a radius within a range between 30-50 mm.

11. A magnetic field shield housing for an electronic component, the magnetic field shield housing comprising:
an electronic control unit;
a housing body defining an interior volume, said electronic control unit disposed within said interior volume;
a plurality of tunable resonant loops disposed planarly within said housing body and arranged within said housing in a regular grid arrangement or an offset grid arrangement, each of said plurality of tunable resonant loops having at least one lumped component; and
a magnetic field generated by said electronic control unit, said magnetic field inducing a loop current in each of said plurality of tunable resonant loops and said loop currents producing at least one magnetic null point within said interior volume of said housing body.

12. The magnetic field shield housing of claim 11, wherein said housing body is a dielectric substrate, said plurality of tunable resonant loops disposed on said dielectric substrate.

13. The magnetic field shield housing of claim 12, wherein said at least one lumped component is a capacitor.

14. The magnetic field shield housing of claim 13, further comprising an electrical control signal supplied to said at least one lumped component of each of said plurality of tunable resonant loops;
said at least one lumped component being a variable capacitor and said electrical control signal varying a capacitive value of each of said plurality of tunable resonant loops.

* * * * *